US009552673B2

(12) United States Patent
Hilliges et al.

(10) Patent No.: US 9,552,673 B2
(45) Date of Patent: Jan. 24, 2017

(54) GRASPING VIRTUAL OBJECTS IN AUGMENTED REALITY

(71) Applicant: Microsoft Corporation, Redmond, WA (US)

(72) Inventors: Otmar Hilliges, Cambridge (GB); David Kim, Cambridge (GB); Shahram Izadi, Cambridge (GB); Malte Hanno Weiss, Aachen (DE)

(73) Assignee: Microsoft Technology Licensing, LLC, Redmond, WA (US)

( * ) Notice: Subject to any disclaimer, the term of this patent is extended or adjusted under 35 U.S.C. 154(b) by 541 days.

(21) Appl. No.: 13/653,968

(22) Filed: Oct. 17, 2012

(65) Prior Publication Data

US 2014/0104274 A1    Apr. 17, 2014

(51) Int. Cl.
| | |
|---|---|
| *G06T 19/00* | (2011.01) |
| *G06T 15/08* | (2011.01) |
| *G06F 3/01* | (2006.01) |
| *G06T 19/20* | (2011.01) |
| *G06T 7/20* | (2006.01) |

(52) U.S. Cl.
CPC ............. *G06T 19/006* (2013.01); *G06F 3/011* (2013.01); *G06T 7/2066* (2013.01); *G06T 15/08* (2013.01); *G06T 19/20* (2013.01); *G06T 2207/10028* (2013.01); *G06T 2219/2016* (2013.01); *G06T 2219/2021* (2013.01)

(58) Field of Classification Search
None
See application file for complete search history.

(56) References Cited

U.S. PATENT DOCUMENTS

| | | | |
|---|---|---|---|
| 2004/0236541 A1* | 11/2004 | Kramer et al. | 703/1 |
| 2006/0152532 A1 | 7/2006 | Sen | |
| 2009/0128552 A1 | 5/2009 | Fujiki et al. | |
| 2011/0261083 A1 | 10/2011 | Wilson | |

(Continued)

OTHER PUBLICATIONS

Otmar Hilliges, David Kim, Shahram Izadi, Malte Weiss, Andrew D. Wilson, "HoloDesk: Direct 3D Interactions with a Situated See-Through Display", May 10, 2012, ACM, CHI '12 Proceedings of the SIGCHI Conference on Human Factors in Computing Systems, pp. 2421-2430.*

(Continued)

*Primary Examiner* — Robert Bader
(74) *Attorney, Agent, or Firm* — Tom Wong; Micky Minhas; Zete Law, P.L.L.C.

(57) ABSTRACT

An augmented reality system which enables grasping of virtual objects is described such as to stack virtual cubes or to manipulate virtual objects in other ways. In various embodiments a user's hand or another real object is tracked in an augmented reality environment. In examples, the shape of the tracked real object is approximated using at least two different types of particles and the virtual objects are updated according to simulated forces exerted between the augmented reality environment and at least some of the particles. In various embodiments 3D positions of a first one of the types of particles, kinematic particles, are updated according to the tracked real object; and passive particles move with linked kinematic particles without penetrating virtual objects. In some examples a real-time optic flow process is used to track motion of the real object.

18 Claims, 10 Drawing Sheets

(56) References Cited

U.S. PATENT DOCUMENTS

| | | |
|---|---|---|
| 2012/0113140 A1 | 5/2012 | Hilliges et al. |
| 2012/0113223 A1 | 5/2012 | Hilliges et al. |
| 2012/0117514 A1 | 5/2012 | Kim et al. |

OTHER PUBLICATIONS

Benjamin Petit, Jean-Denis Lesage, Clément Menier, Jérémie Allard, Jean-Sébastien Franco, Bruno Raffin, Edmond Boyer, François Faure, "Multicamera Real-Time 3D Modeling for Telepresence and Remote Collaboration", 2010, Hindawi, International Journal of Digital Multimedia Broadcasting, vol. 2010, Article ID 247108, pp. 1-12.*

Jeremie Allard, Stephane Cotin, Francois Faure, Pierre-Jean Bensoussan, Francois Poyer, Christian Duriez, Herve Delingette, Laurent Grisoni, "SOFA—an Open Source Framework for Medical Simulation", Feb. 2007, IOP Press, MMVR 15 Medicine Meets Virtual reality.*

Mores Prachyabrued, Christoph W. Borst, "Dropping the Ball: Releasing a Virtual Grasp", Mar. 20, 2011, IEEE, IEEE Symposium on 3D User Interfaces 2011, pp. 59-66.*

Christian Theobalt, Joel Carranza, Marcus A. Magnor, Han-Peter Seidel, "Enhancing Silhouette-based Human Motion Capture with 3D Motion Fields", Oct. 10, 2003, IEEE, Proceedings of the 11$^{th}$ Pacific Conference on Computer Graphics and Applications (PG'03), pp. 185-193.*

Sundar Vedula, Simon Baker, Peter Rander, Robert Collins, Takeo Kanade, "Three-Dimensional Scene Flow", Sep. 27, 1999, IEEE, The Proceedings of the Seventh IEEE International Conference on Computer Vision, vol. 2, pp. 722-729.*

Gavriel J. Iddan, Giora Yahav, "3D Imaging in the Studiot (and Elsewhere . . . )", Apr. 13, 2001, SPIE, Proc. SPIE 4298, Three-Dimensional Image Capture and Applications IV, pp. 48-55.*

Jeremie Allard, Jean-Denis Lesage, Bruno Raffin, "Modularity for Large Virtual Reality Applications", Apr. 2010, MIT Press, Presence: Teleoperators and Virtual Environments, pp. 142-161.*

Bert De Decker, Tom Mertens, Philippe Bekaert, "Interactive Collision Detection for Free-Viewpoint Video", 2007, INSTICC, GRAPP 2007: Proceedings of the Second International Conference on Computer Graphics Theory and Applications, vol. AS/IE, pp. 114-120.*

Christoph W. Borst, Arun P. Indugula, "A Spring Model for Whole-Hand Virtual Grasping", Feb. 2006, MIT Press, Presence: Teleoperators and Virtual Environments, vol. 15, No. 1, pp. 47-61.*

Jérémie Allard, Clément Menier, Bruno Raffin, Edmond Boyer, François Faure, "GrImage: Markerless 3D Interactions", 2007, ACM, SIGGRAPH 2007 Emerging Technologies, Article No. 9.*

Matthew Price, Vasile Murariu, Garry Morrison, "Sphere clump generation and trajectory comparison for real particles", Aug. 29, 2007,Proceedings of Fifth International Conference on Discrete Element Methods, Brisbane, pp. 1-8.*

Francois Conit, Oussama Khatib, Charles Baur, "Interactive rendering of deformable objects based on a filling sphere modeling approach", Sep. 19, 2003, ICRA '03 IEEE International Conference on Robotics and Automation, 2003, vol. 3, pp. 3716-3721.*

Edilson de Aguiar, Christian Theobalt, Marcus Magnor, Holger Theisel, Hans-Peter Seidel, "M3: Marker-free Model Reconstruction and Motion Tracking from 3D Voxel Data", 2004, IEEE, Proceedings of the 12$^{th}$ Pacific Conference on Computer Graphics and Applications.*

Philip M Hubbard, "Approximating Polyhedra with Spheres for Time-Critical Collision Detection", Jul. 1996, ACM, ACM Transactions on Graphics, vol. 15, Issue 3, pp. 179-210.*

Gareth Bradshaw, Carol O'Sullivan, "Sphere-Tree Construction using Dynamic Medial Axis Approximation", 2002, ACM, Proceedings of the 2002 ACM SIGGRAPH/Eurographics symposium on Computer Animation, pp. 33-40.*

* cited by examiner

GRASPING VIRTUAL OBJECTS IN AUGMENTED REALITY

BACKGROUND

In augmented reality applications the real world is enhanced with virtual computer graphics. Modern computing hardware and software enables the creation of rich, realistic 3D virtual environments. Such 3D virtual environments are widely used for gaming, education/training, prototyping, and any other application where a realistic virtual representation of the real world is useful. To enhance the realism of these 3D virtual environments, physics simulations are used to control the behavior of virtual objects in a way that resembles how such objects would behave in the real world under the influence of Newtonian forces. This enables their behavior to be predictable and familiar to a user.

It is, however, difficult to enable a user to interact with these 3D virtual environments in a natural manner where direct-as-possible interactions with virtual objects are enabled. Most interactions with 3D virtual environments happen via indirect input devices such as mice, keyboards or joysticks. Other, more direct input paradigms have been explored as means to manipulate virtual objects in such virtual environments. Among them is pen-based input control, and also input from vision-based multi-touch interactive surfaces. However, in such instances there is the mismatch of input and output. Pen-based and multi-touch input data is inherently 2D which makes many interactions with the 3D virtual environments difficult if not impossible. For example, the grasping of objects to lift them or to put objects into containers etc. cannot be readily performed using 2D inputs.

In the real world users readily apply a variety of strategies to manipulate objects such as pushing, pulling, dragging and grasping using the full dexterity of human hands. Previous approaches to enabling virtual objects to be manipulated in these ways have involved detecting and tracking iconic gestures made by human hands and using those detected and tracked gestures to put virtual objects under grasping and other types of control. Other approaches have involved using inverse kinematics to track an articulated model of a human hand and using the tracked model to enable manipulation of objects in some ways.

The embodiments described below are not limited to implementations which solve any or all of the disadvantages of known augmented reality systems.

SUMMARY

The following presents a simplified summary of the disclosure in order to provide a basic understanding to the reader. This summary is not an extensive overview of the disclosure and it does not identify key/critical elements or delineate the scope of the specification. Its sole purpose is to present a selection of concepts disclosed herein in a simplified form as a prelude to the more detailed description that is presented later.

An augmented reality system which enables grasping of virtual objects is described such as to stack virtual cubes or to manipulate virtual objects in other ways. In various embodiments a user's hand or another real object is tracked in an augmented reality environment. In examples, the shape of the tracked real object is approximated using at least two different types of particles and the virtual objects are updated according to simulated forces exerted between the augmented reality environment and at least some of the particles. In various embodiments 3D positions of a first one of the types of particles, kinematic particles, are updated according to the tracked real object; and passive particles move with linked kinematic particles without penetrating virtual objects. In some examples a real-time optic flow process is used to track motion of the real object.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Although the present examples are described and illustrated herein as being implemented in a desktop computing system, the system described is provided as an example and not a limitation. As those skilled in the art will appreciate, the present examples are suitable for application in a variety of different types of computing systems such as mobile systems and dedicated virtual and augmented reality systems.

A virtual object may be an object represented in a 3D display or at least part of an object represented in a 3D display. A virtual object may be partly real and partly virtual, for example, a real plant with virtual flowers on it.

Described herein is a technique for enabling 3D interaction between a user and a 3D virtual environment in a manner that enables grasping of virtual objects in a natural and realistic manner and yet is computationally efficient. The user can use their hand in a natural way to interact with virtual objects by grasping, scooping, lifting, pushing, and pulling objects. This is much more intuitive than the use of a pen, mouse, or joystick. This is achieved by tracking a user's hand or other real object and approximating at least part of the tracked surface of that object as it moves and/or deforms using at least two types of particles. A simulation of physical forces acting between the tracked real object (represented by the two types of particles) and a virtual environment ensures rich, predictable, and realistic interaction. The two types of particles are referred to in this document as kinematic particles and passive particles. The particles may be of any rigid 3D shape such as spheres, ellipsoids, or other 3D shapes. Kinematic particles have 3D positions in the virtual environment which are updated according to the tracked real object as it moves or deforms in the virtual environment. The kinematic particles may therefore be moved freely with respect to virtual objects based on the tracked position of the real object. This means that a kinematic particle may have a 3D position which is within a virtual object. (Where a user has no haptic feedback he or she is unable to feel the surface of a virtual object and may put his or her fingers into the virtual object when trying to grasp it.) A passive particle has a 3D position in the virtual environment which is related to a kinematic particle to which it is linked and without being within the volume of a virtual object. A physics simulator simulates rigid body interactions between the passive particles (representing the real object) and the virtual objects. For example, collision forces between passive particles and virtual objects and/or friction forces between passive particles and virtual objects. Output from the physics simulator may be used to update a display of the virtual objects to enable interaction with the virtual environment. Because the kinematic particles do not take part in the rigid body simulation, if these particles have a 3D position which is within a virtual object, the physics simulation remains stable. A passive particle may be linked to a kinematic particle in the physics simulator so that, when a passive particle collides with a virtual object, rigid body simulation by the physics simulator prevents the passive particle from penetrating the virtual object. By using the two types of particles to represent the tracked real object it is possible to enable virtual grasping in a manner which is more natural than previously possible.

Figure 1:
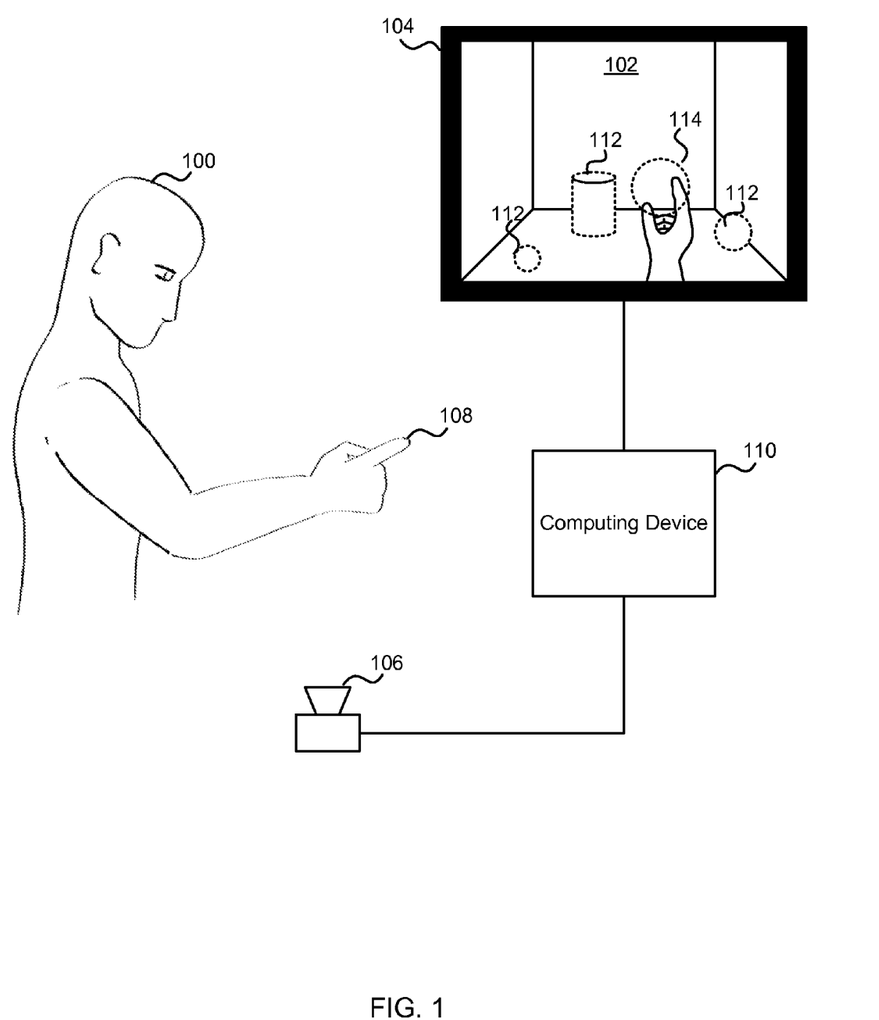
FIG. 1 is a schematic diagram of an interactive 3D computer graphics system.

Reference is first made to FIG. 1, which illustrates an interactive 3D computer graphics system. FIG. 1 shows a user 100 interacting with a 3D virtual environment 102 which is displayed on a display device 104. The display device 104 can, for example, be a regular computer display, such as a liquid crystal display (LCD) or organic light emitting diode (OLED) panel (which may be a transparent OLED display), or a stereoscopic, autostereoscopic, or volumetric display. The use of a stereoscopic, autostereoscopic or volumetric display enhances the realism of the 3D environment by enhancing the appearance of depth in the 3D virtual environment 102. In other examples, the display device 104 can be in a different form, such as head-mounted display (for use with either augmented or virtual reality), a projector, or as part of a dedicated augmented/virtual reality system (such as the example augmented reality system described below with reference to FIG. 9).

A camera 106 is arranged to capture images of the user's hand 108 or other real object in the virtual environment. The space in the environment from which the camera is able to capture images is referred to as an interaction volume. In one example, the camera 106 is a depth camera (also known as a z-camera), which generates both intensity/color values and a depth value (i.e. distance from the camera) for each pixel in the images captured by the camera. The depth camera can be in the form of a time-of-flight camera, stereo camera or a regular camera combined with a structured light emitter. The use of a depth camera enables three-dimensional information about the position, movement, size and orientation of the user's hand 108 to be determined. In some examples, a plurality of depth cameras can be located at different positions, in order to avoid occlusion when multiple hands are present, and enable accurate tracking to be maintained.

In other examples, a regular 2D camera can be used to track the 2D position, posture and movement of the user's hand 108, in the two dimensions visible to the camera. A plurality of regular 2D cameras can be used, e.g. at different positions, to derive 3D information on the user's hand 108.

The camera provides the captured images of the user's hand 108 to a computing device 110. The computing device 110 is arranged to use the captured images to track the user's hand 108, and determine the locations of various points on the hand, as outlined in more detail below. In some examples, the computing device 110 uses this information to generate a virtual representation of the user's hand 108, which is inserted into the virtual environment 102 (the computing device 110 can also generate the virtual environment). In other examples, the user views his or her actual hand or other real object in the virtual environment 102. The computing device 110 determines the interaction of the virtual representation 112 with one or more virtual objects 112, 114 present in the virtual environment 102, as outlined in more detail below. In the example shown in FIG. 1 the user is grasping one of the virtual objects 114 which is a virtual sphere. Details on the structure of the computing device are discussed with reference to FIGS. 2 and 10.

Note that, in other examples, the user's hand 108 can be tracked without using the camera 106. For example, a wearable position sensing device, such as a data glove, can be worn by the user, which comprises sensors arranged to determine the position of the digits of the user's hand 108, and provide this data to the computing device 110.

In some examples another camera may be used to track a position of the user's head. In this way head tracking may be used to create viewpoint corrected renderings of the virtual environment, making motion parallax a depth cue for the user. However, this is not essential, other approaches may be used such as where stereo is used as a depth cue.

The camera(s), a virtual image plane and a fixed real world origin may be calibrated using a one-off procedure which may be automated or at least partially automated. Any suitable calibration procedure may be used such as a checkerboard calibration process.

Figure 2:
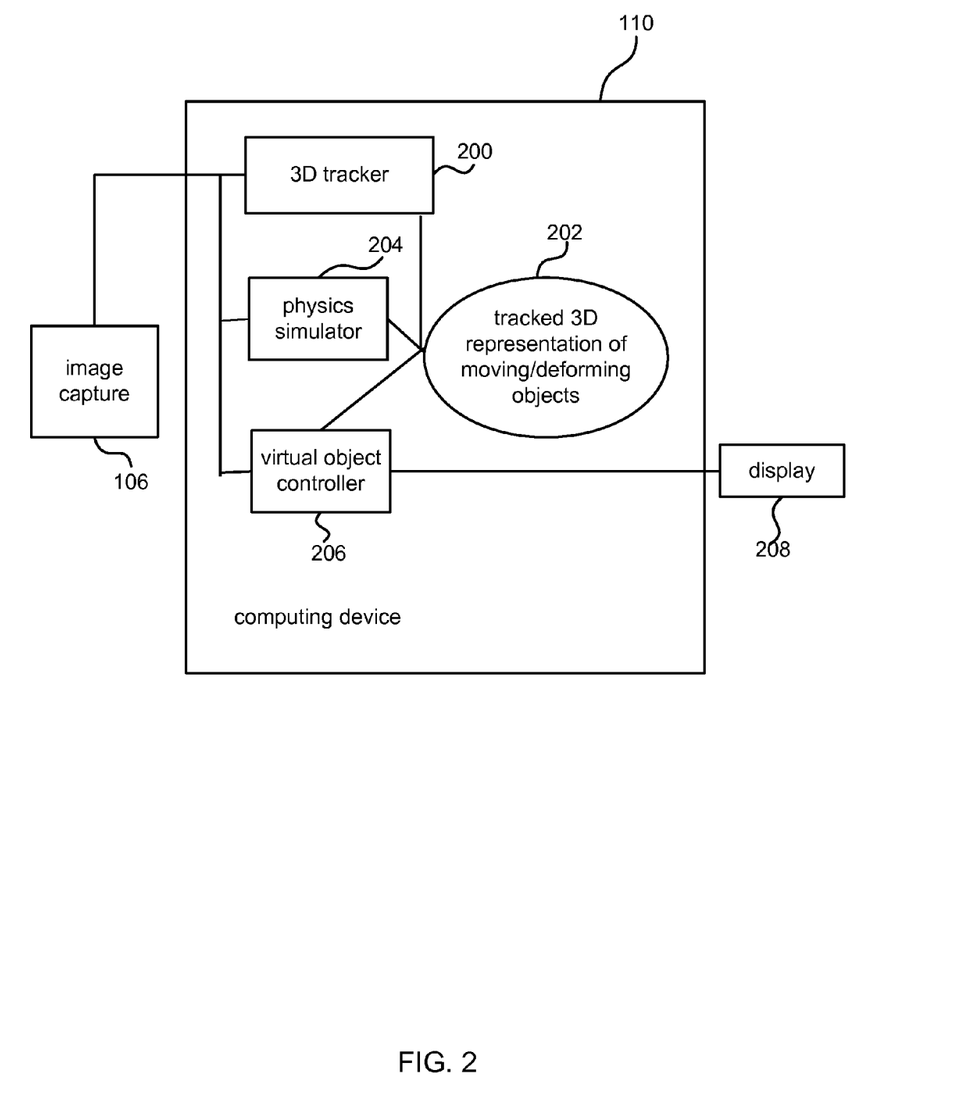
FIG. 2 is a schematic diagram of the computing device of FIG. 1.

Reference is now made to FIG. 2, which illustrates the computing device 110 of FIG. 1 in more detail. The camera 106 provides captured images to the computing device 110 which comprises a 3D tracker 200. The 3D tracker calculates a shape of real objects in the interaction volume. This is achieved using the captured images. In embodiments where a wearable position sensing device is used, the 3D tracker uses data from that sensing device to track the shape of real objects in the augmented reality environment. The 3D tracker may track the shape of the real objects as they move and/or deform in the augmented reality environment. For example, a piece of paper may flex and bend and this deformation may be tracked.

In addition to calculating the shape of real objects in the augmented reality environment the 3D tracker computes 3D position and motion estimates of a plurality of regions of the real objects. The regions may be surface patches or volumetric regions for example.

The shape or the surface of the real objects is approximated using a plurality of rigid particles. The particles may be spheres, ellipsoids or other 3D shapes as mentioned above. To approximate the shape the contour of the tracked real shapes are filled with a plurality of kinematic particles so that the 3D position of a kinematic particle is related to (for example, matches, taking into account different co-ordinate systems) the 3D position of one of the regions of the real objects. In other examples, parts of a real object are tracked. For example, fingertips. In this and other situations it is possible to track the fingertips or other surfaces of parts of objects and approximate those with kinematic particles by placing kinematic particles at the fingertips or other surfaces. As the real objects move and/or deform the 3D positions of the regions or surfaces are updated and so are the kinematic particle positions. In this way a tracked 3D representation 202 of the real moving and/or deforming objects is obtained. This representation may be created by the 3D tracker 200 and/or a physics simulator 204.

The physics simulator 204 is any computer-implemented functionality which is able to carry out simulation of forces exerted on or between rigid bodies and laws of motion and gravity applied to those rigid bodies.

The physics simulator is arranged to add passive particles to the tracked 3D representation 202. For example, each kinematic particle has an associated dynamic particle to which it is linked. The link or connection between a kinematic particle and passive particle pair may be a spring and damper connection or any other connection which enables the passive particle to be moved by the kinematic particle to which it is connected.

The physics simulator takes as input 3D positions of the kinematic particles and knowledge of the virtual objects as rigid bodies. It calculates updated 3D positions of passive particles according to the way it models the links between the kinematic particles and the passive particles (for example, using a spring and damper model or other model) and also according to forces (such as friction and/or collision forces) between the passive particles and the virtual objects. These forces replicate the effect of equivalent forces in the real world, and make the interaction predictable and realistic for the user. The physics simulator provides as output updated 3D positions of the virtual objects. The physics simulator may store the passive particle positions so that these persist as the real objects are tracked.

A virtual object controller 206 receives the 3D positions of the virtual objects and updates a display 208 which displays the virtual objects. This generated the 3D virtual environment 102 that the user is to interact with. The virtual environment 102 can be any type of 3D scene that the user can interact with. For example, the virtual environment 102 can comprise virtual objects such as prototypes/models, blocks, spheres or other shapes, buttons, levers or other controls. The virtual object controller 206 may also display a virtual representation of the real objects in some examples using input from the 3D tracker. However, this is not essential.

Collision forces exerted by the passive particles may be simulated, so that when the real object moves or deforms in collision with a virtual object, the collision is modeled appropriately in the virtual environment. This also allows virtual objects to be scooped up by the user's hand, a virtual representation of the user's hand or another object (real or virtual). Virtual objects may be lifted by exerting a force underneath the virtual object. Gravity can also be simulated so that the virtual object falls to the floor if released when lifted in the virtual environment 102.

Figure 3:
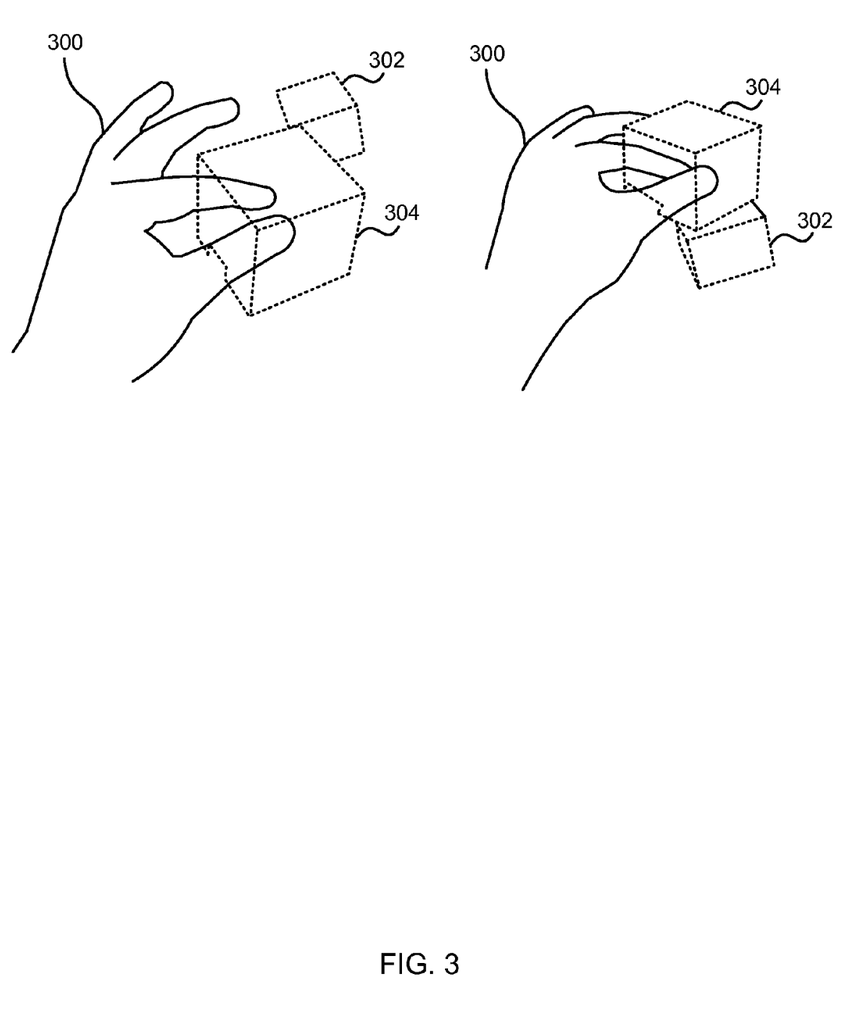
FIG. 3 is a schematic diagram of a user stacking two virtual cubes using the interactive 3D computer graphics system of FIG. 1.

Friction forces may also be simulated. This allows the user to control the virtual representation and interact with the virtual objects by grasping or pinching the objects. For example, as shown in FIG. 3, a user's hand 300 may grasp virtual cube 302 and stack it on top of a second virtual cube 304. The friction forces acting between the passive particles in the representation of the user's hand and the side of the virtual object are sufficient to stop the virtual cube from dropping. Friction forces can also control how the virtual objects slide over surfaces in the virtual environment 102.

The virtual objects can also be manipulated in other ways, such as stretching, bending, and deforming, as well as operating mechanical controls such as buttons, levers, hinges, handles etc.

The above-described 3D user interaction technique therefore enables a user to control and manipulate virtual objects in a manner that is rich and intuitive, simply by using their hands as if they were manipulating a real object. This is achieved without excessive computational complexity by representing the real objects using both kinematic and passive particles which are accurately tracked using 3D motion estimates of regions of the real objects. The computing device 110 does not need to use pre-programmed application logic to analyze the gestures that the user is making and translate these to a higher-level function. Instead, the interactions are governed by exerting collision and friction forces akin to the real world. This increases the interaction fidelity in such settings, for example by enabling the grasping of objects to then manipulate their position and orientation in 3D in ways a real world fashion. Six degrees-of-freedom manipulations are possible which were previously difficult or impossible when controlling the virtual environment using mouse devices, pens, joysticks or touch surfaces, due to the input-output mismatch in dimensionality.

Figure 4:
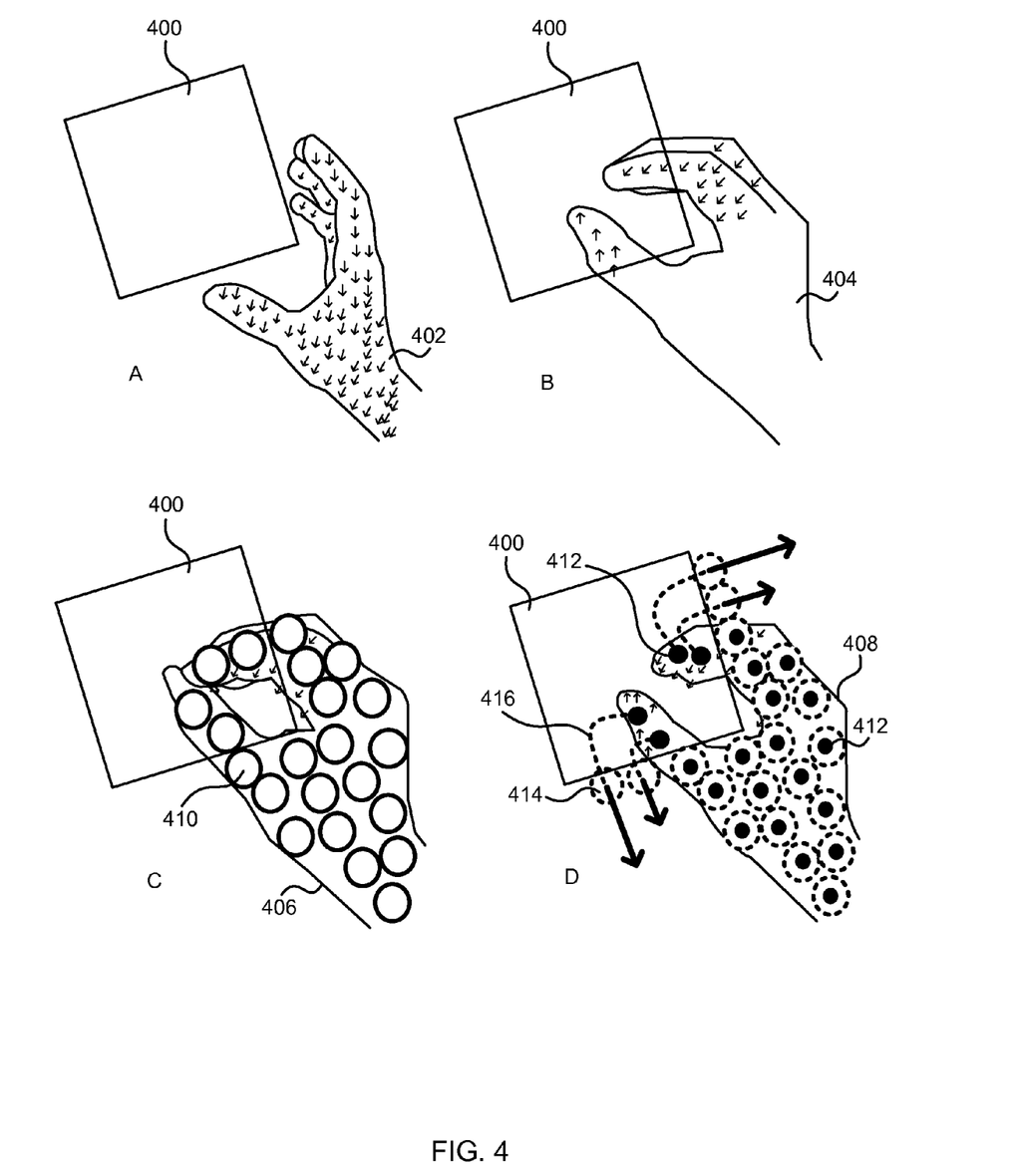
FIG. 4 is a schematic diagram of a user's hand reaching for and grasping a virtual cube and illustrating tracked optical flow, virtual object penetration, and two types of particles used to approximate the user's hand.

FIG. 4 shows a user's hand reaching for and grasping a virtual cube and illustrating tracked optical flow, virtual object penetration, and two types of particles used to approximate the user's hand. A user's hand 402 reaches for a virtual cube 400. The 3D shape of the user's hand 402 is calculated from images of an interaction volume in which the user's hand is placed. Optical flow of patches or regions of the user's hand are calculated and used to give 3D motion estimates of the patches or regions. In FIG. 4 the 3D motion estimates are illustrated using arrows where the size of the arrow is related to speed and the direction of the arrow to the direction of motion. In part A of FIG. 4 the user's thumb moves away from the palm and the arrows on the thumb illustrate this. In part B of FIG. 4 the user's thumb moves towards his or her fingers. The thumb and fingers of the hand 404 penetrate the virtual cube 400 because the user has no haptic feedback and is unable to feel the virtual cube 400. In part C of FIG. 4 the user's hand 406 has a thumb which touches the fingers and the thumb and fingers penetrate the virtual cube 400. The shape of the hand is approximated by filling it with a plurality of particles 410 which in this example are pairs of kinematic and passive particles which may be coincident kinematic particles are shown as dotted circles and passive particles are shown as circles with solid outlines. In this example the particles are spheres. Particles may have other shapes as described above.

In part D of FIG. 4 the physics simulator has calculated updated positions for the passive particles 414 and the kinematic particles 412 remain in their original positions. A passive particle may be linked to a kinematic particle by a joint 416 and in FIG. 4 four examples of such joints are illustrated as curved lines. As the kinematic particles 412 do not take part in a rigid body simulation carried out by the physics simulator these kinematic particles may have positions inside the volume of a virtual object such as virtual cube 400. The passive particles 414 do take part in the rigid body simulation and so do not enter the virtual cube. Because the passive particles are modeled by the physics simulator as being linked to kinematic particles by a spring and damper or other type of joint, these passive particles 414 remain on the surface of the virtual cube and experience a force pulling them towards the associated kinematic particle as a result of the joints 416. This force models a real world friction force between the user's digit and the virtual cube. Even though the kinematic particles may have positions inside the volume of a virtual object the physics simulator is able to give robust and stable output in contrast to previous approaches. For example, some previous approaches have produced unstable virtual reality environments where the virtual objects displayed are disrupted and the virtual reality display breaks down in situations where real objects or parts of real object enter virtual objects. In various embodiments described herein the physics simulator is arranged to calculate the position of the virtual object in a robust, stable manner when at least part of the real object penetrates the virtual object in the virtual reality environment. In various embodiments the physics simulator is arranged to determine the simulated forces using passive particles which do not enter the virtual object, the passive particles being linked to kinematic particles which approximate the surface of at least part of the real object.

Figure 5:
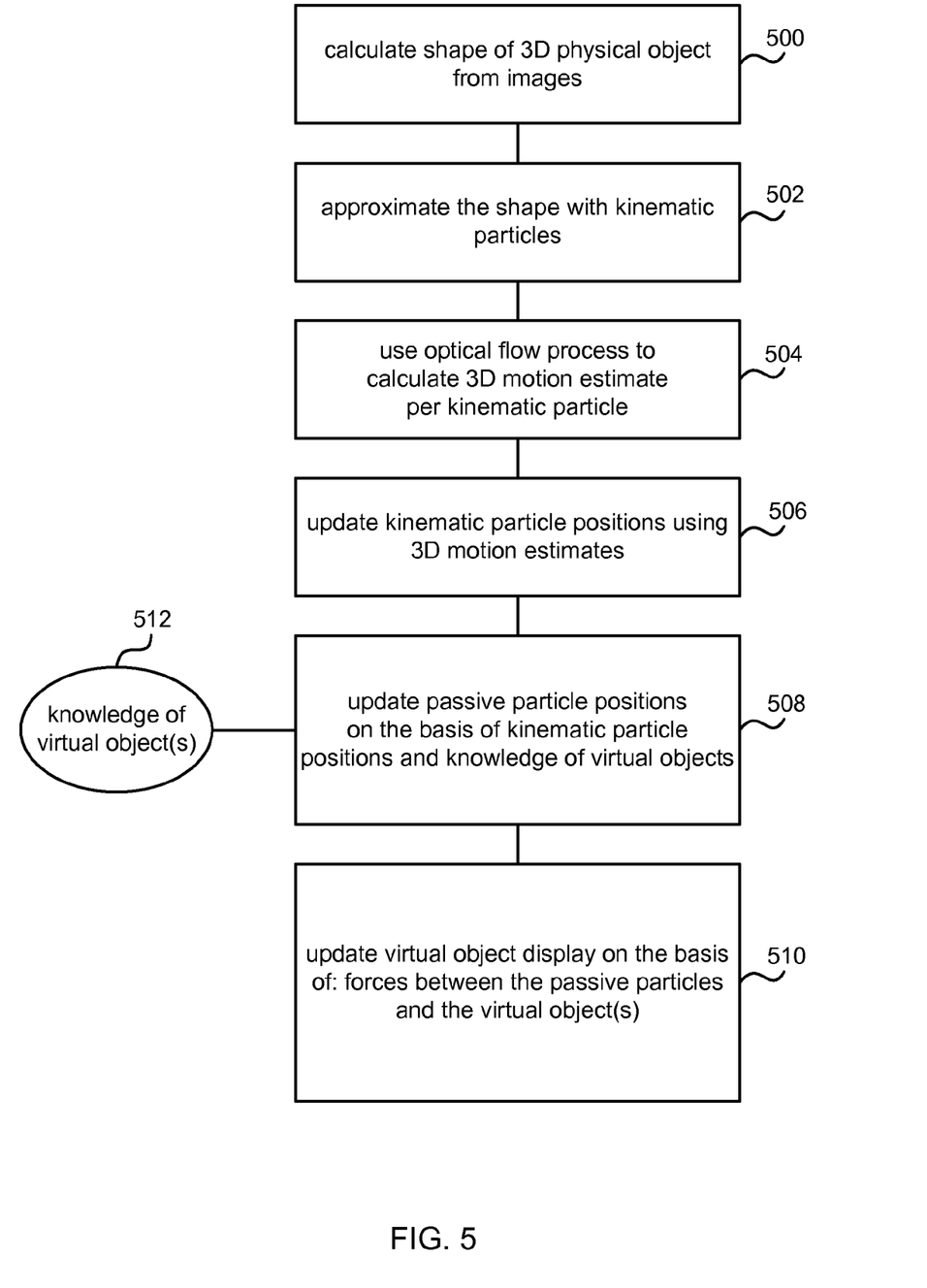
FIG. 5 is a flow diagram of process at the 3D tracker, physics simulator and virtual object controller of FIG. 2.

FIG. 5 is a flow diagram of process at the 3D tracker, physics simulator and virtual object controller of FIG. 2. The 3D tracker receives a plurality of images of a real object in the interaction volume associated with the virtual reality environment. The images may be from a combined RGB and depth camera or from any other camera as described above. The 3D tracker tracks 3D motion and/or deformation of a surface of the real object in the interaction volume using the received images. For example, the 3D tracker calculates 500 the surface of the real object as a shape of the 3D physical object from the images. In an example the shape is calculated by using smoothed depth data from the depth camera to compute a polygon mesh of the real object on a graphics processing unit (GPU) in real time. This is described in more detail below with reference to FIG. 6. The resulting mesh represents parts of the real object which are visible to the depth camera. However, it is also possible to compute a 3D representation of the real object surface which includes parts of the object which are not visible to the image capture device. For example, using template matching or other techniques and where appropriate computational resources are available. In other examples, a surface of the real object is tracked where sparse tracking is available. For example, the surface may be a tip of a digit of a user's hand. In that situation, by tracking surfaces of digit tips rather than a surface or shape of a whole hand, computational resources are reduced. This may be suitable for applications where grasping is to be simulated without the need for other interactions such as scooping, lifting and pushing.

The 3D tracker and/or the physics simulator approximate 502 the tracked surface with kinematic particles. In cases where the tracked surface is part of a tracked shape the shape may be filled with kinematic particles. In cases where tracking of the surface yields contours (such as representing fingertips) which are not volumes kinematic particles may be placed along or at the tracked surface.

The 3D tracker tracks 3D motion and/or deformation of the surface of the real object in the interaction volume using the received images. For example, the 3D tracker may use 504 an optical flow process to calculate the 3D motion and/or deformation. Any suitable optical flow process may be used. For example, patch match, scene flow, or others. An example optical flow process is described in more detail below which is may be implemented on a GPU and which makes use of a depth look up process to achieve robustness, accuracy and efficiency. The optical flow process may be arranged to provide a 3D motion estimate for each of the kinematic particles used to approximate the real object.

The physics simulator may be arranged to calculate a position of a virtual object in the virtual reality environment according to simulated forces between the virtual object and the real object, the simulated forces being determined at least using the tracked 3D motion and/or deformation. For example, the physics simulator may model, for at least some of the kinematic particles, a linked passive particle. Each passive particle may be linked to a kinematic particle using a joint or connection with a known behavior such as a spring and damper joint or others. The physics simulator may take the passive particles into account during a rigid body simulation and exclude the kinematic particles from that rigid body simulation.

The physics simulator may update 506 the kinematic particle positions using the 3D motion estimates from the 3D tracker. It may also update 508 the passive particle positions on the basis of the kinematic particle positions, the links between passive and kinematic particles and knowledge 512 of the virtual objects. The knowledge of the virtual objects may comprise a representation of the virtual environment including rigid body models of the virtual objects.

Using the updated passive particle positions the physics simulator carries out a rigid body simulation of the passive particles and the virtual objects by taking into account at least friction forces between the particles and/or virtual objects. Other forces may also be taken into account such as gravity, collision forces and other forces. In this way the physics simulator calculates updated positions of the virtual objects.

A virtual controller is able to update 510 a display of the virtual environment on the basis of the simulated forces between the passive particles and the virtual object(s).

Figure 6:
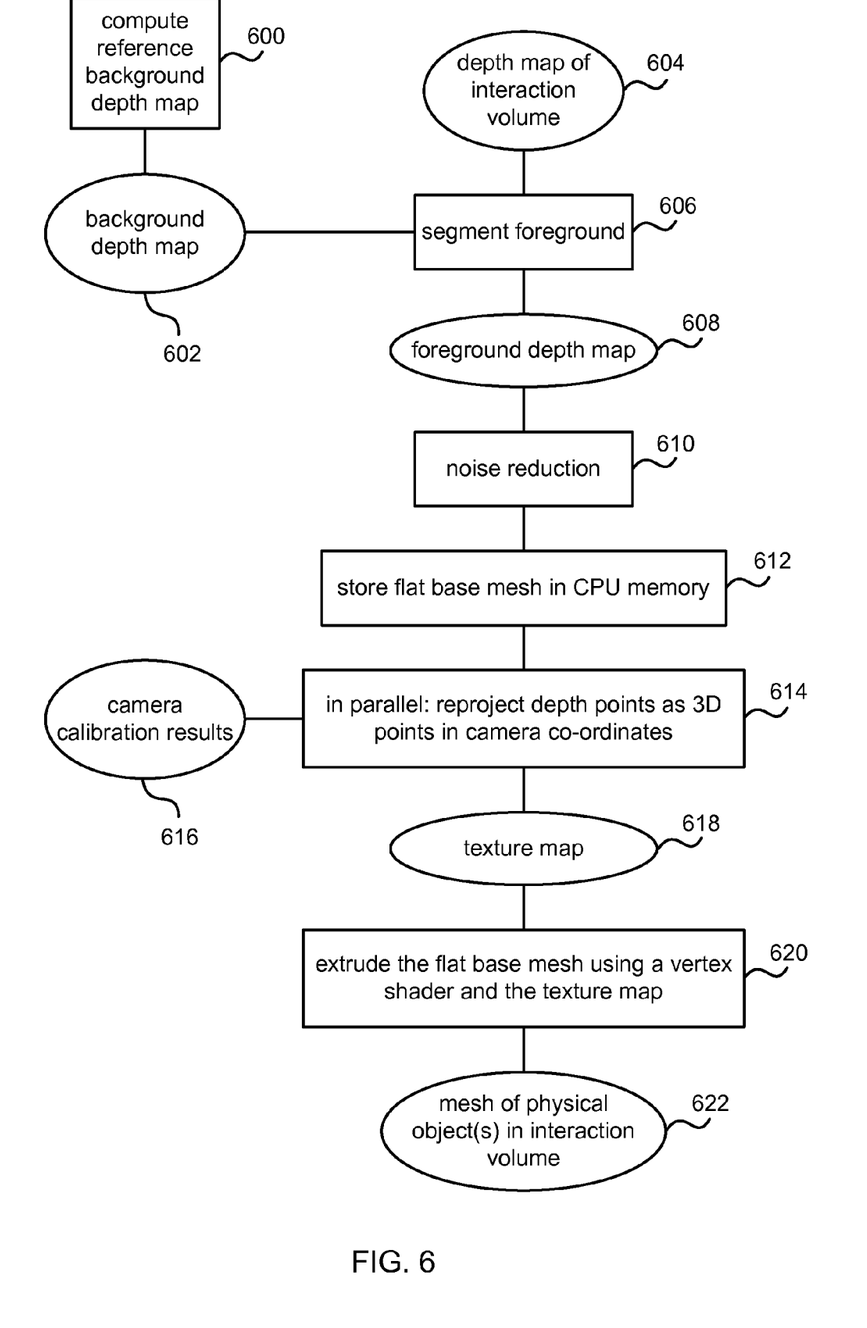
FIG. 6 is an example of the process of calculating a shape of a 3D physical object of FIG. 5 in more detail.

FIG. 6 is an example of the process of calculating a shape of a 3D physical object of FIG. 5 in more detail. A reference background depth map is computed 600 by aggregating a plurality of depth maps from a depth camera (where the camera 106 comprises a depth camera). This may be done without any physical objects present in the interaction volume to provide a background depth map 602. The 3D tracker receives a depth map 604 of the interaction volume where one or more real objects or parts of real objects are interacting with a virtual reality environment. Using the background depth map 602 the received depth map is segmented 606 to obtain a foreground depth map 608 depicting the real objects or parts of real objects. A noise reduction process 610 is optionally applied to the foreground depth map, for example, by applying a depth edge preserving bilateral filter.

A flat base polygon mesh is stored 612 in graphics processing unit (GPU) memory. A pixel shader may be used in parallel 614 to reproject depth map points (or groups of aggregated depth map points) as 3D points in camera coordinate space. Camera calibration results 616 are used for the reprojection. The 3D points in camera coordinate space are stored as a texture map 618. Using the texture map 618 the base mesh is extruded 620 using a vertex shader. Normals are calculated using a cross product between neighboring reprojected 3D points in the texture map. The vertex shader may also be arranged to cull polygons from the mesh where invalid depth measurements occur and/or where depth discontinuities in the depth map are greater than a threshold.

Using the method of FIG. 6 real objects or parts of real objects in the interaction volume may be meshed 622 in real-time. From the mesh shadows may be cast onto the 3D virtual scene to enhance the realism and usability of the augmented reality system.

Figure 7:
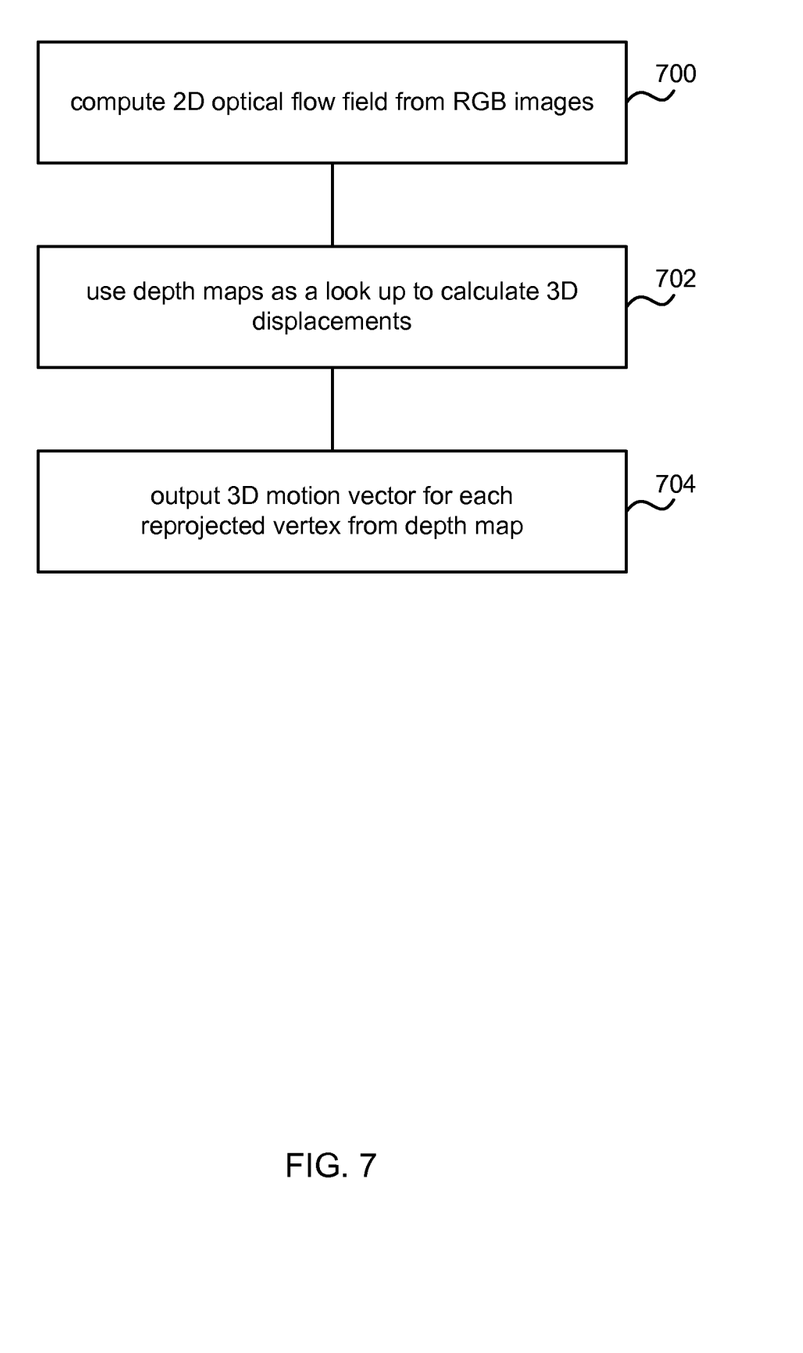
FIG. 7 is an example of a process of using optical flow to calculate a 3D motion estimate for kinematic particles.

FIG. 7 is an example of a process of using optical flow to calculate a 3D motion estimate for kinematic particles. Using an optical flow process enables deforming or dynamically changing objects to be tracked as well as rigid objects. A non-exhaustive list of examples of a deforming object is a user's hand, a piece of paper, a liquid, a piece of fabric. In the example of FIG. 7 a 2D optical flow field is calculated using an intensity image from an RGB camera and a depth map associated with the intensity image is used as a lookup to calculate 3D displacements and obtain a 3D optical flow field. This has been found to be more robust than computing 3D optical flow directly from depth maps. Nevertheless, computing 3D optical flow directly from depth maps is workable and may be used in some embodiments.

With reference to FIG. 7 a 2D optical flow field may be computed 700 by the 3D tracker from intensity images obtained from an RGB camera. Any suitable optical flow process may be used to compute the 2D optical flow field. Depth maps associated with the intensity images may be used as a look up 702 by the 3D tracker to calculate 3D displacements of elements of the surface of the real object tracked by the 3D tracker. An element may be a vertex of a mesh where the 3D tracker calculates a polygon mesh of the mesh of the real object. An element may also be a group of vertices of the mesh or may be any other patch or region on the tracked surface of the real object. The 3D tracker may output 704 the 3D displacements in the form of a 3D motion vector for each reprojected vertex from the depth map or as a 3D motion estimate for any other element of a surface of the tracked real object.

An example of an optical flow process which may be used in the process of FIG. 7 is now described. This is one example and other optical flow processes are possible.

As RGB images are received at the optical flow process these may be rectified to a depth camera used to capture the depth maps. The rectification takes into account intrinsic and extrinsic camera calibration matrices which are obtained using any suitable calibration method. A background depth map (such as described above with reference to FIG. 6) is used to segment the RGB images in order to give foreground RGB images. A 2D optical flow is then calculated between successive pairs of foreground RGB images. This is done by searching, for each image element in a first foreground RGB image, for a corresponding image element in a subsequent foreground RGB image. The search considers possible solutions and picks one which tends to give a smooth flow field and a relatively constant frame to frame image element brightness. This enables smooth optical flow fields to be produced while avoiding over-smoothing at depth discontinuities. This is helpful where real objects or parts of real objects overlap in the interaction volume. For example, where hands are placed above each other.

At least part of the 2D optical flow process and/or the look up into the depth maps as described with reference to FIG. 7 may be implemented at a GPU in order to increase processing speed and enable the augmented reality system to operate in real time.

Once the 3D motion estimates are available from the optical flow process at the 3D tracker, the physics simulator and/or the 3D tracker are able to generate and update kinematic particles per frame to approximate the surface of real objects in the interaction volume. This is now described with reference to FIG. 8.

Figure 8:
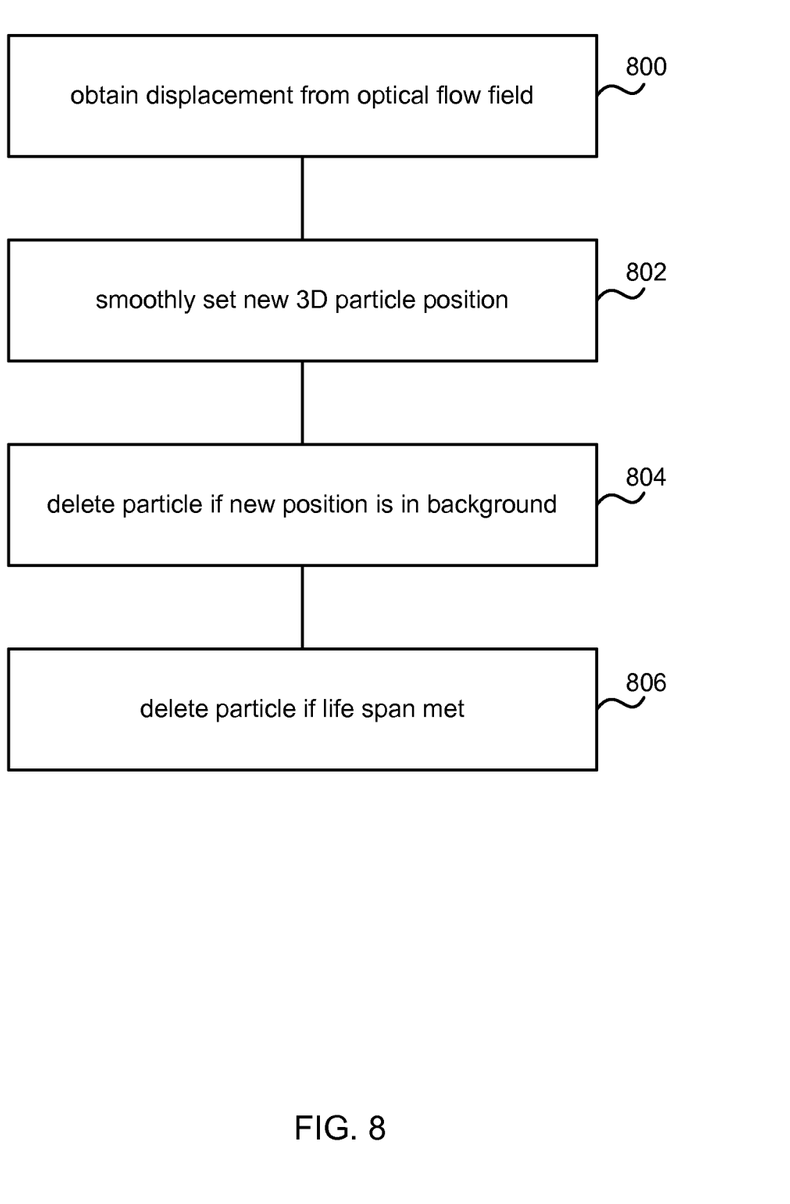
FIG. 8 is an example of a process of updating kinematic particle positions using 3D motion estimates.

An image element in a foreground of an RGB image may have an associated kinematic particle. The position of that particle in the virtual environment is calculated using a depth from a depth map associated with the RGB image and using the camera calibration results. The optical flow field is used to obtain 800 a displacement associated with the particle. This displacement represents how the particle has moved as part of the moving/deforming real object in the interaction volume. The physics simulator and/or 3D tracker smoothly sets 802 a new 3D position for the kinematic particle using the displacement and a suitable smoothing process. The kinematic particle may be deleted 804 it its new position falls in the background of the depth map indicating that no correspondences were found in the optical flow process for the image element associated with the kinematic particle. The kinematic particle may also be deleted if a specified life span 806 of the particle is met. This enables a balance to be achieved between overall particle density and inherent tracking errors.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), Graphics Processing Units (GPUs). For example, some or all of the tracking module (110 of FIG. 1) functionality may be performed by one or more hardware logic components.

Figure 9:
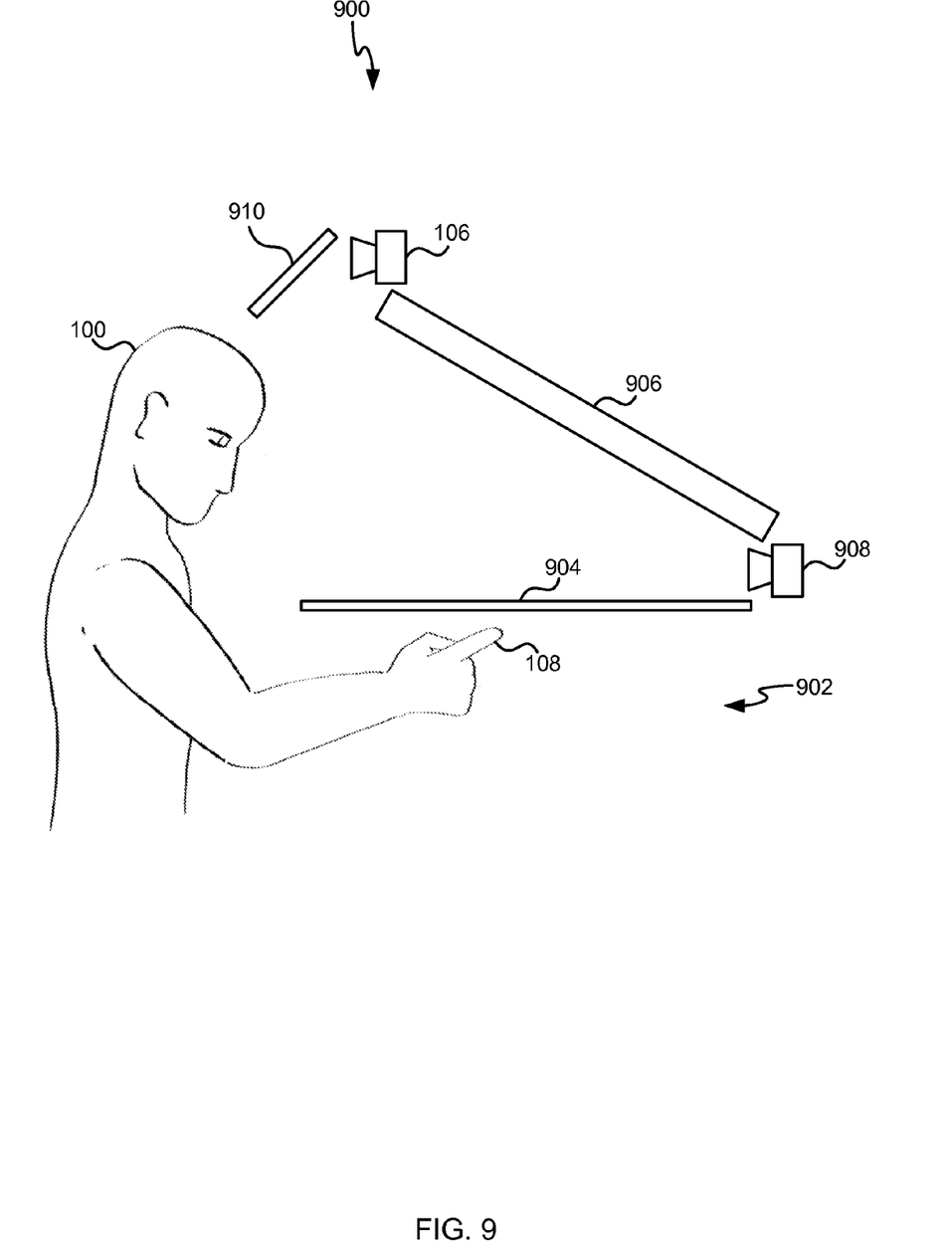
FIG. 9 is a schematic diagram of an augmented reality system.

Reference is now made to FIG. 9, which illustrates an example augmented reality system in which the 3D user interaction technique outlined above can be utilized. FIG. 9 shows the user 100 interacting with an augmented reality system 900. The augmented reality system 900 comprises a display device 906 illustrated in this example as a liquid crystal display (LCD) and an optical beam splitter 910. The display device displays a 3D virtual environment as described above. In this example the user 100 has placed his or her hand 108 into an interaction volume 902. The augmented reality system 900 further comprises an optical beam-splitter 904. The optical beam-splitter 904 reflects a portion of incident light, and also transmits (i.e. passes through) a portion of incident light. This enables the user 100, when viewing the surface of the optical beam-splitter 904, to see through the optical beam-splitter 904 and also see a reflection on the optical beam-splitter 904 at the same time (i.e. concurrently). In one example, the optical beam-splitter 904 can be in the form of a half-silvered mirror.

The optical beam-splitter 904 is positioned in the augmented reality system 900 so that, when viewed by the user 100, it reflects light from the LCD 906 and transmits light from the interaction volume 902. Therefore, the user 100 looking at the surface of the optical beam-splitter can see the reflection of the 3D virtual environment displayed by the LCD 906, and also their hand 108 in the interaction volume 902 at the same time. Hence, the relative arrangement of the interaction volume 902, optical beam-splitter 904, and LCD 906 enables the user 100 to simultaneously view both a reflection of a computer generated image (the virtual environment) from the LCD and the hand 108 located in the interaction volume 902. Therefore, by controlling the graphics displayed in the reflected virtual environment, the user's view of their own hand in the interaction volume 902 can be augmented, thereby creating an augmented reality environment.

Note that in other examples, different types of display can be used. For example, a transparent OLED panel can be used, which can display the augmented reality environment, but is also transparent. Such an OLED panel enables the augmented reality system to be implemented without the use of an optical beam splitter.

The augmented reality system 900 also comprises the camera 106, which captures images of the user's hand 108 in the user interaction region 902, to allow the tracking of the set of point locations, as described above. In the example shown in FIG. 9 the camera 106 is mounted above the LCD and a mirror is used to fold the camera's optics allowing it to sense the full interaction volume while limiting the overall height of the setup. In other examples the camera 106 may be located below the interaction volume. In order to further improve the spatial registration of the virtual environment with the user's hand 108, a further camera 908 can be used to track the face, head or eye position of the user 100. Using head or face tracking enables perspective correction to be performed, so that the graphics are accurately aligned with the real object. The further camera 908 shown in FIG. 9 is positioned between the display device 906 and the optical beam-splitter 904. However, in other examples, the camera 908 can be positioned anywhere where the user's face can be viewed, including within the user-interaction region 902 so that the camera 908 views the user through the optical beam-splitter 904. Not shown in FIG. 9 is the computing device 110 that performs the processing to generate the virtual environment and controls the virtual representation, as described above.

Figure 10:
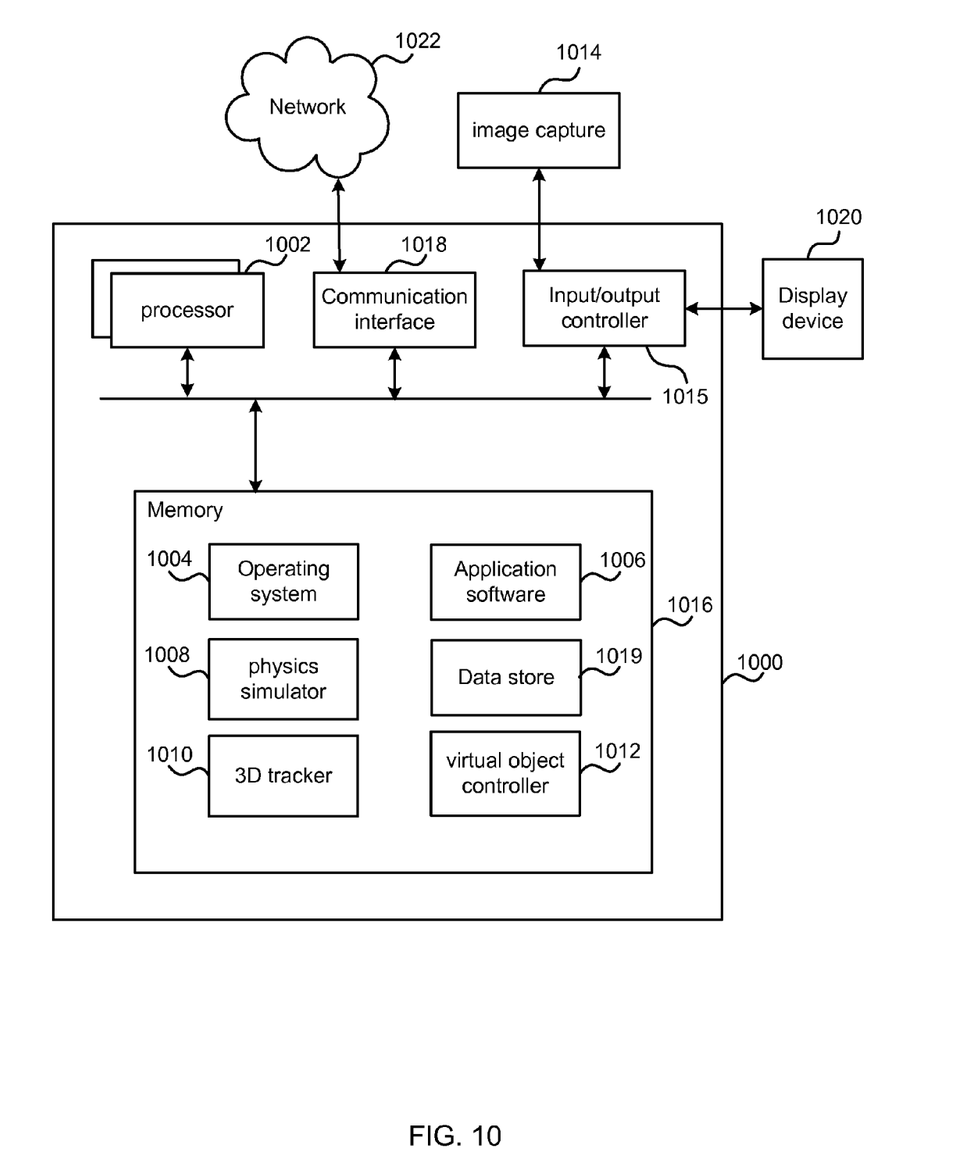
FIG. 10 illustrates an exemplary computing-based device for use with the augmented reality systems and techniques described herein.

FIG. 10 illustrates various components of an exemplary computing-based device 1000 which may be implemented as any form of computing and/or electronic device, and in which embodiments of the computing device 110 of FIG. 1 may be implemented as part of an augmented reality system.

Computing-based device 1000 comprises one or more processors 1002 which may be microprocessors, controllers or any other suitable type of processors for processing computer executable instructions to control the operation of the device in order to receive captured images and use those images to control generation of a virtual reality environment coupled to 3D motion and/or deformation of real objects depicted in the images. In some examples, for example where a system on a chip architecture is used, the processors 1002 may include one or more fixed function blocks (also referred to as accelerators) which implement a part of the method of tracking the 3D motion and/or deformation of the real objects in hardware (rather than software or firmware). Other parts of the methods, such as generating the virtual reality display in response to the tracked 3D motion and/or deformation may also be implemented in hardware rather than software or firmware.

Platform software comprising an operating system 1004 or any other suitable platform software may be provided at the computing-based device to enable application software 1006 to be executed on the device.

The computing-based device 1000 may also comprise a physics simulator 1008 arranged to calculate updated positions of virtual objects in a virtual environment on the basis of forces exerted on or between the virtual objects and real objects represented using pluralities of particles. A 3D tracker 1010 may be provided to calculate the shape of real objects depicted in images and to calculate 3D motion estimates of the real objects. A data store 1019 may store images captured by one or more image capture devices 1014, parameter values, calibration results, models of links between kinematic and passive particles, and other data. A virtual object controller 1012 may be provided to update a virtual object display on the basis of output from the physics simulator and/or 3D tracker for example.

The computer executable instructions may be provided using any computer-readable media that is accessible by computing based device 1000. Computer-readable media may include, for example, computer storage media such as memory 1016 and communications media. Computer storage media, such as memory 1016, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Therefore, a computer storage medium should not be interpreted to be a propagating signal per se. Propagated signals may be present in a computer storage media, but propagated signals per se are not examples of computer storage media. Although the computer storage media (memory 1016) is shown within the computing-based device 1000 it will be appreciated that the storage may be distributed or located remotely and accessed via a network 1022 or other communication link (e.g. using communication interface 1018).

The computing-based device 1000 may comprise an input/output controller 1015 arranged to output display information to a display device 1020 which may be separate from or integral to the computing-based device 1000. The display information may provide a virtual reality environment which is coupled to real world objects moving and/or deforming in that environment, or for other display purposes. The input/output controller 1015 is also arranged to receive and process input from one or more devices, such as a user input device (e.g. a mouse, keyboard, camera, microphone or other sensor). In some examples the user input device may detect voice input, user gestures or other user actions and may provide a natural user interface (NUI). This user input may be used to calibrate the image capture devices 1014, set parameter values, or for other purposes. In an embodiment the display device 1020 may also act as the user input device if it is a touch sensitive display device. The input/output controller 1015 may also output data to devices other than the display device, e.g. a locally connected printing device.

The input/output controller 1015 may be in communication with one or more image capture devices 1014 such as one or more cameras which may be RGB cameras, depth cameras, web cams, or other image capture devices. This enables the computing-based device 1000 to receive images captured by the image capture devices 1014 and optionally to control the image capture devices 1014. The image capture devices 1014 may be integral with the computing-based device 1000 or may be in communication with the computing-based device wirelessly or in other ways.

The input/output controller 1015, display device 1026 and optionally user input device may comprise NUI technology which enables a user to interact with the computing-based device in a natural manner, free from artificial constraints imposed by input devices such as mice, keyboards, remote controls and the like. Examples of NUI technology that may be provided include but are not limited to those relying on voice and/or speech recognition, touch and/or stylus recognition (touch sensitive displays), gesture recognition both on screen and adjacent to the screen, air gestures, head and eye tracking, voice and speech, vision, touch, gestures, and machine intelligence. Other examples of NUI technology that may be used include intention and goal understanding systems, motion gesture detection systems using depth cameras (such as stereoscopic camera systems, infrared camera systems, rgb camera systems and combinations of these), motion gesture detection using accelerometers/gyroscopes, facial recognition, 3D displays, head, eye and gaze tracking, immersive augmented reality and virtual reality systems and technologies for sensing brain activity using electric field sensing electrodes (EEG and related methods).

The term 'computer' or 'computing-based device' is used herein to refer to any device with processing capability such that it can execute instructions. Those skilled in the art will realize that such processing capabilities are incorporated into many different devices and therefore the terms 'computer' and 'computing-based device' each include PCs, servers, mobile telephones (including smart phones), tablet computers, set-top boxes, media players, games consoles, personal digital assistants and many other devices.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible (or non-transitory) storage media include computer storage devices comprising computer-readable media such as disks, thumb drives, memory etc. and do not include propagated signals. Propagated signals may be present in a tangible storage media, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A computing device arranged to calculate a virtual object in a virtual reality environment, the computing device comprising:
   an input arranged to receive a plurality of images of at least part of a real object in an interaction volume associated with the virtual reality environment;
   a 3D tracker arranged to track 3D motion and/or deformation of a surface of the real object in the interaction volume using the received images and approximate the surface of the real object by filling the contour of the real object with a plurality of non-intersecting passive particles, wherein each passive particle is linked to one of a plurality of kinematic particles; and
   a physics simulator arranged to calculate the position of the virtual object in the virtual reality environment according to simulated forces between the virtual object and the real object, the simulated forces being determined at least using the tracked 3D motion and/or deformation, the plurality of passive particles, and the plurality of kinematic particles, wherein the simulated forces are determined such that the passive particles cannot penetrate the virtual object or the other passive particles.

2. A device as claimed in claim 1 the physics simulator being arranged to calculate the position of the virtual object in a robust, stable manner when the at least part of the real object penetrates the virtual object in the virtual reality environment.

3. A device as claimed in claim 1 wherein the 3D tracker is arranged to delete at least one of the plurality of kinematic particles.

4. A device as claimed in claim 1 where the images comprise depth maps and RGB images.

5. A device as claimed in claim 1 where the 3D tracker is arranged to calculate a 2D optical flow field from intensity images and to calculate a 3D optical flow field from the 2D optical flow field by looking up depth values of elements of the 2D optical flow field in depth maps associated with the intensity images.

6. A device as claimed in 1 wherein the 3D tracker comprises a graphics processing unit arranged to calculate an optical flow field of the surface of the real object.

7. A device as claimed in claim 1 wherein the 3D tracker comprises a graphics processing unit arranged to calculate a surface of the real object.

8. A device as claimed in claim 1 wherein the 3D tracker comprises a graphics processing unit arranged to calculate a 3D shape of the real object.

9. A device as claimed in claim 1 wherein the 3D tracker is at least partially implemented using hardware logic selected from any one or more of: a field-programmable gate array, a program-specific integrated circuit, a program-specific standard product, a system-on-a-chip, a complex programmable logic device and a graphics processing unit.

10. A computer-implemented method of calculating a virtual object in a virtual reality environment comprising:
receiving, at a processor, a plurality of images of at least part of a real object in an interaction volume associated with the virtual reality environment;
tracking 3D motion and/or deformation of a surface of the real object in the interaction volume using the received images and approximate the surface of the real object by filling the contour of the real object with a plurality of non-intersecting passive particles, wherein each passive particle is linked to one of a plurality of kinematic particles; and
calculating a position of the virtual object in the virtual reality environment according to simulated forces between the virtual object and the real object, the simulated forces being determined at least using the tracked 3D motion and/or deformation, the plurality of passive particles, and the plurality of kinematic particles, wherein the simulated forces are determined such that the passive particles cannot penetrate the virtual object or the other passive particles.

11. A method as claimed in claim 10 comprising calculating the position of the virtual object in a robust, stable manner when the at least part of the real object penetrates the virtual object in the virtual reality environment.

12. A method as claimed in claim 10 comprising using the tracked 3D motion and/or deformation to delete at least one of the plurality of kinematic particles.

13. A method as claimed in claim 10 comprising calculating a 2D optical flow field from intensity images and calculating a 3D optical flow field from the 2D optical flow field by looking up depth values of elements of the 2D optical flow field in depth maps associated with the intensity images.

14. A computer-implemented method of simulating grasping of a virtual object comprising:
receiving, at a processor, a plurality of images of at least part of a user's hand in an interaction volume having an associated virtual reality environment visible to the user;
tracking 3D motion and/or deformation of a surface of the user's hand in the interaction volume using the received images and approximate the surface of the user's hand by filling the contour of the user's hand with a plurality of non-intersecting passive particles, wherein each passive particle is linked to one of a plurality of kinematic particles; and
calculating a position of the virtual object in the virtual reality environment according to simulated forces between the virtual object and the user's hand, the simulated forces being determined at least using the tracked 3D motion and/or deformation, the plurality of passive particles, and the plurality of kinematic particles in order that when the user grasps the virtual object corresponding simulated grasping in the virtual reality environment is calculated, wherein the simulated forces are determined such that the passive particles cannot penetrate the virtual object or the other passive particles.

15. A method as claimed in claim 14 comprising calculating the position of the virtual object in a robust, stable manner when the at least part of the real object penetrates the virtual object in the virtual reality environment.

16. A method as claimed in claim 14 comprising displaying the virtual object in the virtual reality environment according to the calculated position of the virtual object.

17. A method as claimed in claim 14 comprising displaying the virtual object and the virtual reality environment in a robust, stable manner when the at least part of the real object penetrates the virtual object in the virtual reality environment.

18. A method as claimed in claim 14 at least partially implemented using hardware logic selected from any one or more of: a field-programmable gate array, a program-specific integrated circuit, a program-specific standard product, a system-on-a-chip, a complex programmable logic device and a graphics processing unit.

* * * * *